United States Patent
Heragu et al.

(10) Patent No.: US 12,149,221 B2
(45) Date of Patent: Nov. 19, 2024

(54) ANALOG FIR FILTER

(71) Applicant: Semtech Corporation, Camarillo, CA (US)

(72) Inventors: Aravind Heragu, Renens (CH); Eric Vandel, Concise (CH)

(73) Assignee: SEMTECH CORPORATION, Camarillo, CA (US)

( * ) Notice: Subject to any disclaimer, the term of this patent is extended or adjusted under 35 U.S.C. 154(b) by 726 days.

(21) Appl. No.: 17/370,565

(22) Filed: Jul. 8, 2021

(65) Prior Publication Data

US 2022/0021374 A1   Jan. 20, 2022

(30) Foreign Application Priority Data

Jul. 14, 2020 (EP) .................................... 20185720

(51) Int. Cl.
*H03H 17/02* (2006.01)
*H03H 17/00* (2006.01)

(52) U.S. Cl.
CPC ..... *H03H 17/02* (2013.01); *H03H 2017/0081* (2013.01)

(58) Field of Classification Search
CPC ................. H03H 2017/0081; H03H 11/1291
See application file for complete search history.

(56) References Cited

U.S. PATENT DOCUMENTS

| | | | | |
|---|---|---|---|---|
| 2009/0021297 A1* | 1/2009 | Yoshizawa | ........... | H03H 15/023 327/554 |
| 2010/0171548 A1* | 7/2010 | Ohannaidh | ............ | H03H 15/02 327/552 |
| 2010/0179977 A1* | 7/2010 | Wei | ......... | H03H 15/02 708/313 |
| 2013/0120033 A1* | 5/2013 | Huang | ............... | H03H 21/0007 327/146 |
| 2017/0077905 A1* | 3/2017 | Choi | ........................ | G06F 17/10 |
| 2020/0321943 A1* | 10/2020 | Thijssen | ................ | H03H 15/00 |

FOREIGN PATENT DOCUMENTS

JP   4-284714 A2   10/1992

OTHER PUBLICATIONS

A. Agrawal, et al., "A 19-GB/s Serial Link Receiver with Both 4-Tap FFE and 5-Tap DFE Functions in 45-nm SOI CMOS", IEEE Journal of Solid-State Circuits, vol. 47, No. 12, Dec. 2012, 12 pgs.

(Continued)

*Primary Examiner* — Emily E Larocque
*Assistant Examiner* — Huy Duong
(74) *Attorney, Agent, or Firm* — BLANK ROME LLP

(57) ABSTRACT

A FIR filter (15), comprising an input terminal for receiving an input signal, a first filtering circuit comprising: a first transconductance device (30*a*) configured to generate a first current signal (i1) proportional to the input signal; a first analog switch (41*a*) commuted in n by a first digital gate signal (φ1) and configured to block the current signal when the first digital gate signal has a first value and to transmit the current signal to a first integrating capacitor (45*a*) when the first digital gate signal has a second value; characterized in that the first digital gate signal (φ1) comprises a periodic series of pulses, wherein the pulses have widths proportional to the filter coefficients.

11 Claims, 2 Drawing Sheets

(56) References Cited

OTHER PUBLICATIONS

M. Stanacevic, et al., "Charge-Based CMOS FIR Adaptive Filter", Proc. 43$^{rd}$ IEEE Midwest Symp. on Circuits and Systems, Aug. 8-11, 2000, 4 pgs.
B. J. Thijssen, et al., "A 0.06-3.4 MHz 92 µW Analog FIR Channel Selection Filter with Very Sharp Transition Band for IoT Receivers", IEEE Solid-State Circuit Letters, vol. 2, No. 9, Sep. 2019, pp. 171-174.

* cited by examiner

ANALOG FIR FILTER

REFERENCE DATA

The present application claims priority of European Patent Application EP20185720 of Jul. 14, 2020, the contents whereof are hereby incorporated in their entirety.

TECHNICAL DOMAIN

The invention concerns, in embodiments, a programmable analog FIR filter that can be applied to many signal processing tasks. An important embodiment, which is not however the only use case for the filter of the invention, is a low-pass filter for channel selection in a wireless receiver.

RELATED ART

Analog filters of various topologies are known in the art. Conventionally, analog filters are designed using operational amplifiers or gm-C transconductance amplifiers. These topologies require however multiple gain stages to create high-order filters.

Electronic filters are used in a host of signal processing applications. Modern RF receivers and transmitters rely heavily on electronic filters including, but not exclusively, low-pass filters for channel selection. RF equipment that targets Internet-of-Thing applications should provide enough signal-to-noise ratio for minimal power consumption and the channel filter is an important block in this optimization. Conventional filters based on a multiplicity of gain stages struggle to meet this goal.

The article of B. J. Thijssen, E. A. M. Klumperink, P. Quinlan and B. Nauta, "A 0.06-3.4-MHz 92-μW Analog FIR Channel Selection Filter With Very Sharp Transition Band for IoT Receivers" in *IEEE Solid-State Circuits Letters*, vol. 2, no. 9, pp. 171-174, September 2019, doi:10.1109/LSSC.2019.2935569 proposes an architecture combining strong filtering and low power dissipation with one single variable-gain stage, whose transconductance can be set digitally. While limiting the number of gain stages, this structure adds to the complexity of the receiver.

JPH04284714A discloses a FIR filter with variable coefficients for audio processing and US2010/171548A1 discloses an analogue FIR filter.

SHORT DISCLOSURE OF THE INVENTION

An aim of the present invention is the provision of a filter that overcomes the shortcomings and limitations of the state of the art.

According to the invention, these aims are attained by the object of the attached claims, and especially by A FIR filter, comprising an input terminal for receiving an input signal, a first filtering circuit comprising: a first integrating capacitor, a first transconductance device configured to generate a first current signal proportional to the input signal; a first analog switch commuted by a first digital gate signal and configured to block the current signal when the first digital gate signal has a first value and to transmit the first current signal to the first integrating capacitor when the first digital gate signal has a second value; wherein the first digital gate signal comprises a periodic series of pulses, wherein the pulses have widths proportional to a set of coefficients of the FIR filter.

Dependent claims relate to important and advantageous, though not essential, variants of the invention, such as a gate generator comprising a memory storing the filter coefficients and a digital-to-time converter, wherein the filter coefficients are read from the memory and provided to the digital-to-time converter sequentially and synchronously with a clock signal, and the digital-to-time converter generates for each received filter coefficient a pulse having a width proportional thereto; resetting switches for the first integrating capacitor such that this the charge stored therein is periodically transferred to an output unit and reset, a second transconductance device configured to generate a second current signal proportional to an inverted-phase replica of the input signal; a second analog switch controlled by a second digital gate signal and configured to block the second current signal when the second digital gate signal has the first value and to transmit the second current signal to the first integrating capacitor when the second digital gate signal has the second value; wherein the second gate signal consists in a series of pulses of constant width, a second digital-to-time converter whose input is static to generate the second gate signal.

In a favourable variant, the FIR filter of the invention has a plurality of integrating capacitors and a plurality of analog switches controlled by digital signals and configured to select cyclically an integrating capacitor from the plurality of integrating capacitors, block the current signal when the first digital gate signal has a first value and to transmit the first current signal to the selected integrating capacitor when the first digital gate signal has a second value, block the second current signal when the second digital gate signal has the first value and to transmit the second current signal to the selected integrating capacitor when the second digital gate signal has the second value.

This disposition with many integrating capacitors simplifies the periodic resetting of the integrating capacitors that can be conveniently short-circuited during their periods of inactivity. The number of integrating capacitor can be more than two, to increase the sampling rate of the output signal. For example, in a filter with four integrating capacitors interleaved the sampling rate of the output signal can be doubled. If the number of integrators is equal to the number of coefficients of the FIR filter, the output rate can be made equal to the clock rate.

In the frame of the present disclosure, the term "digital" is used in electronics to designate systems that operate on discretely quantized values, in contrast with "analog" system that operate on continuously variable quantities. The device of the invention enters in this definition of analog circuit, since it filters a continuously variable voltage and produces a continuous filtered output that is not quantized, although the filter coefficients may be quantized and stored in a digital memory, and the circuit operates in discrete steps of time.

SHORT DESCRIPTION OF THE DRAWINGS

Exemplar embodiments of the invention are disclosed in the description and illustrated by the drawings in which:

FIG. 3 is a chronogram plotting signals in the of the filter of FIGS. 2a and 2b, including the timing signals $\phi_{11}$, $\phi_{21}$, $\phi_{12}$, $\phi_{22}$, $\phi_{2r}$, $\phi_{2s}$, $\phi_{1r}$, $\phi_{1s}$, driving the switches of corresponding names of FIG. 2a.

Figure 4:
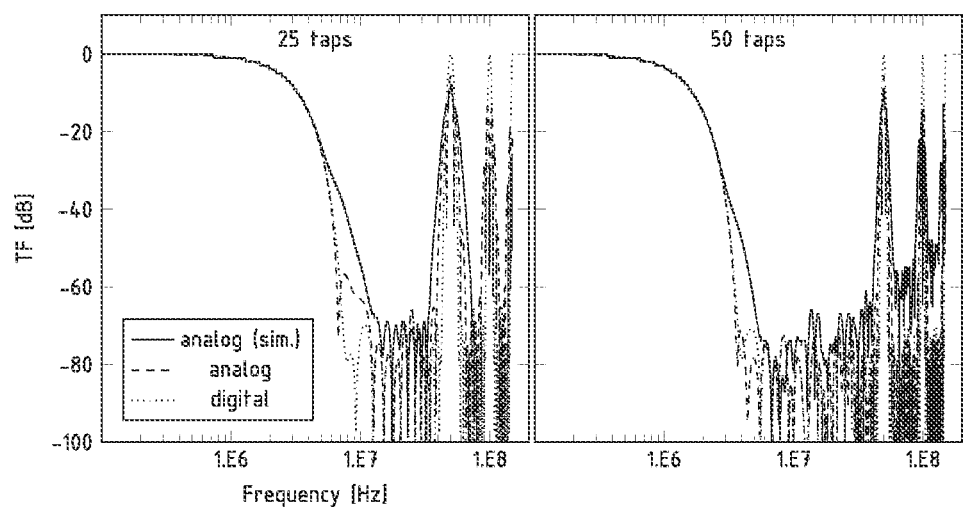

FIG. 4 plots the transfer function of two filters according to the invention, comparing them to those of similar digital filters.

EXAMPLES OF EMBODIMENTS OF THE PRESENT INVENTION

Figure 1:
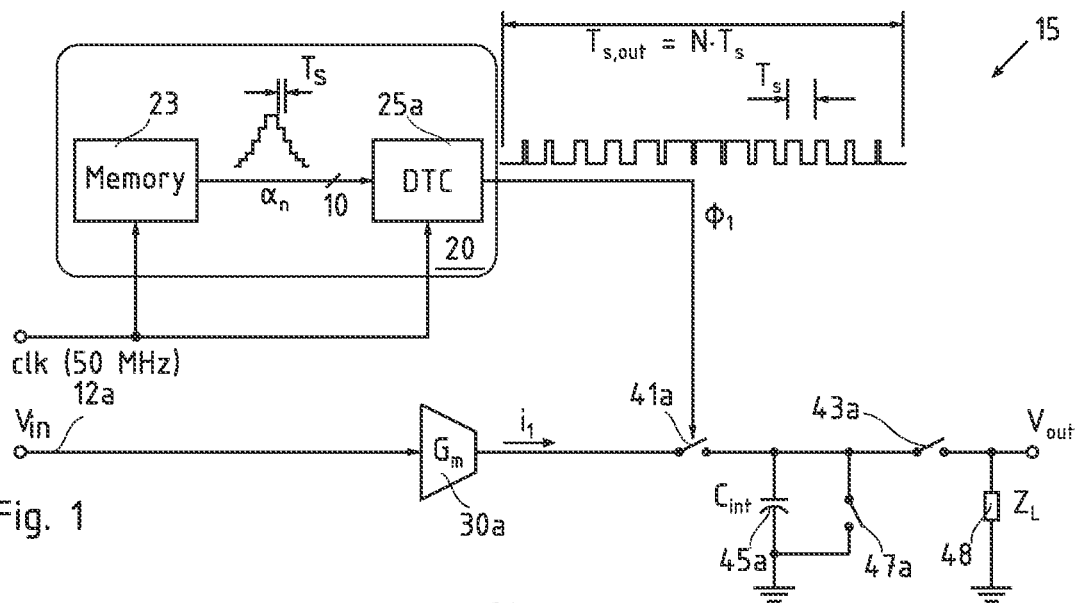
FIG. 1 illustrates schematically a filter according to the invention.

With reference to FIG. 1, the filter 15 of the invention comprises an input terminal 12a that receives a signal $V_{in}$ to be filtered and provides it to the input of a transconductance node 30a to generate a current $I_1$ that is sensibly proportional to the input signal level ($I_1=G_m \cdot V_{in}$). The transconductance node 30a can be realized with any one of the many circuits used in the art to provide a transconductance with fixed gain $G_m$.

An N-tap FIR filter is defined by N real coefficients $\alpha_1, \ldots, \alpha_n$ and can be represented mathematically in the z domain by $$H_{dig}(z) = \sum_{n=0}^{N-1} \alpha_n \cdot z^{-n}.$$

The FIR coefficients $\alpha_0, \ldots, \alpha_{n-1}$ are stored in the memory 23 from which they are read cyclically at each period of a clock signal clk. In the presented example, the clock signal has a frequency of 50 MHz, but this value could change according to the application. The digital values of the coefficients $\alpha_n$ are presented to the input of a digital-to-time converter 25a that generates a gate signal $\phi_1$ consisting in a train of pulses, one per each period of the clock clk, whose width is proportional to the value of one of the coefficients $\alpha_n$. Since the memory 23 is read cyclically, the gate signal $\phi_1$ is periodic and repeats itself after a period $T_{s,out}=N \cdot T_s$, where $T_s$ is the period of the clock signal and N the number of taps.

In the shown example, the data fed from the memory to the DTC have a depth of 10 bit, but the invention could be applied to coefficients represented by digital words of any size.

The switch 41a switches the current $I_1$ with the gate signal $\phi_1$ that encodes the coefficients $\alpha_n$ as pulse widths, such that the integrating capacitor $C_{int}$ receives at each pulse a charge proportional to $V_{in} \cdot G_m \cdot \alpha_n \cdot T_s$. At the end of a period $T_{s,out}$, the charge accumulated in $C_{int}$ will a be proportional to the desired filtered output, and can be transferred to the output terminal $V_{out}$ by closing momentarily the switch 43a, after which the integrating capacitor 45a is reset to zero with the switch 47a and the cycle is repeated.

The signal present $V_{out}$ is therefore a sampled output at a frequency $f_s/N$, where $f_s$ denotes the clock frequency, and N the number of taps of the filter. In other words, the output signal is decimated by a factor N relative to the clock frequency $f_s$. To make an example, to realize a channel filter in a digital receiver the circuit of the invention may be used to synthesize a low-pass filter with a corner frequency of few MHz or lower. This can be obtained by a 25-taps FIR filter whereby, if $f_s=50$ MHz, the output will be sampled at 2 MHz.

The digital-to-time converter 25a can be implemented in many ways by using a counter, a variable slope integrator, a constant slope integrator, or other suitable means. Owing to the non-zero rise and fall times of the DTC output, the DTC output may not be precise enough for low values of an (for short pulses, the duty cycle becomes comparable to the rise and fall time of the DTC). This may result in deviation from the desired transfer function and reduce the attenuation in the stop band.

Figure 1A:
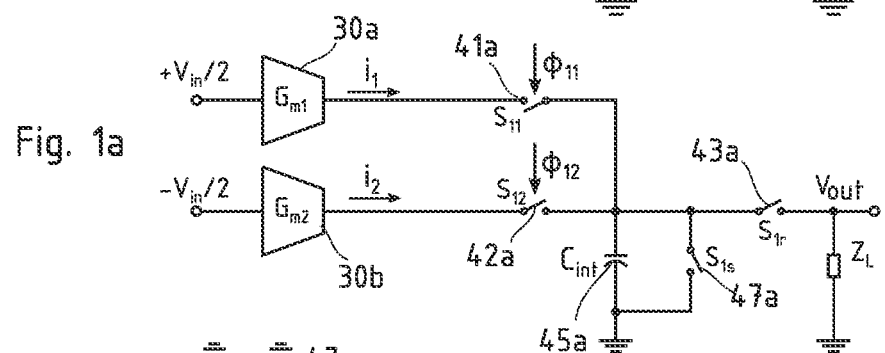
FIG. 1a shows a variant of the invention with two filtering chains, one receiving a positive signal and another receiving the complementary negative signal.

To mitigate this problem, it is advantageous to use two filtering chains, as shown in FIG. 1a, one receiving a positive signal $+V_{in}/2$, and another receiving the complementary negative signal $-V_{in}/2$. The first and second filtering chains have two transconductance nodes 30a respectively 30b, ideally identical, whose outputs are chopped by switches $S_{11}$ and $S_{22}$ and integrated in capacitor 45a.

Figure 2A:
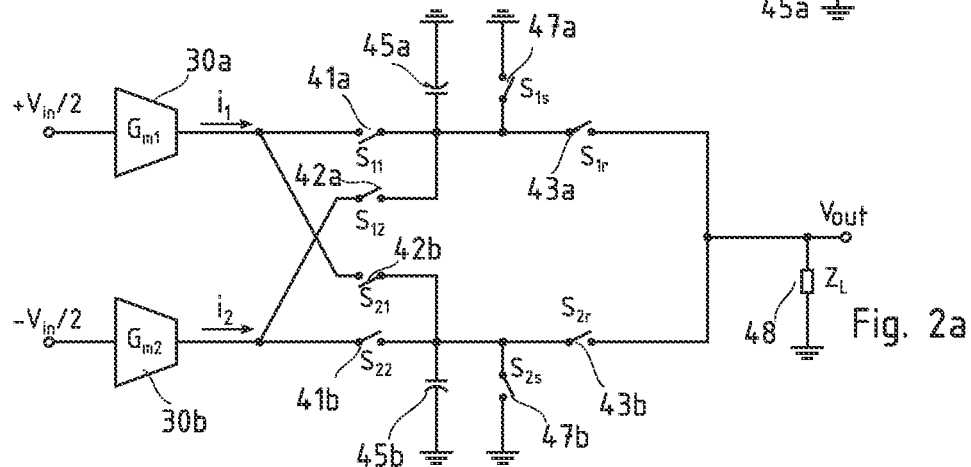
FIGS. 2a and 2b show a variant of the invention with two multiplexed filters.
Figure 2B:
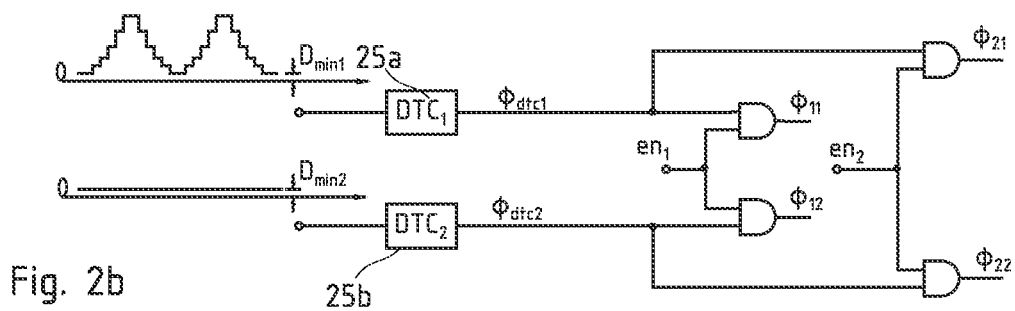

One of the switches—In the drawing, $S_{11}$ in the upper chain connected to the positive input—is driven by a gate signal $\phi_{11}$ encoding the coefficients of the filter, as in FIG. 1, but with a deliberately inserted offset $D_{min1}$, as visible in FIG. 2b. The other switch—$S_{12}$ in this case—is driven by a gate signal $\phi_{12}$ consisting in identical pulses of width $D_{min2}$. The second gate signal may be produced by a second DTC 25b or in any other way. This disposition avoids very short pulses entirely and avoid the errors arising from finite rise and fall times. Any further ill effect that might arise because of mismatch between the paths can be avoided by tuning the values of $D_{min1}$ and $D_{min2}$.

FIGS. 2a and 2b show a variant of the invention where the outputs of the transconductance amplifiers 30a and 30b are presented to two integrators arranged in parallel. In a first filter, the currents $I_1$ and $I_2$ generated by the transconductance amplifiers are integrated in capacitor 45a after having been chopped by switches 14a (S11) and 42a (S12). In a second filter, the same currents $I_1$ and $I_2$ are integrated in capacitor 45b through switches 41b ($S_{22}$) and 42b ($S_{21}$). Each filter has an independent reset switch 47a ($S_{1s}$) respectively 47b ($S_{2s}$) as well as transfer switches 43a ($S_{1r}$) respectively 43b ($S_{2r}$). It will be appreciated that both filters are electrically identical to the filter of FIG. 1a.

Figure 3:
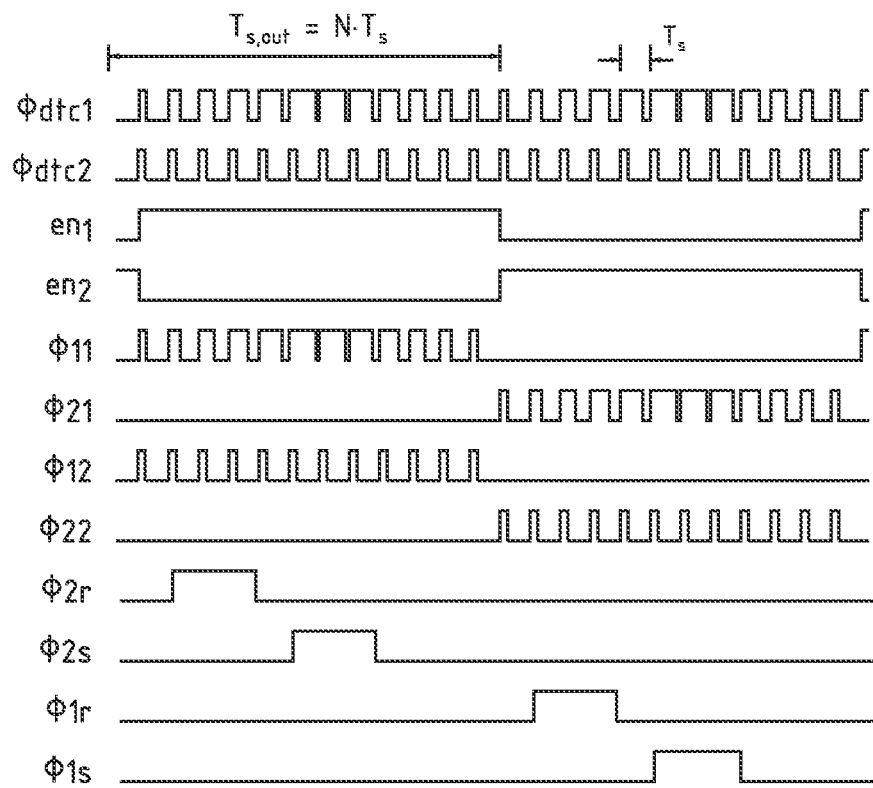

The two filters are operated in time-interleaved mode, the roles exchanging after each period $T_{s,out}$. In a first period if length $T_{s,out}$, the voltage is integrated, for example, in capacitor 45a, In the successive period of the same length, the voltage will be integrated in capacitor 45b, while capacitor 45a is reset by switch 47a each integration, the integrated voltage on the capacitors Cint1(2). The capacitors need to be reset to avoid peaking in the filter response due to IIR (infinite impulse response) effect. The corresponding signals in a possible implementation are presented in the chronogram of FIG. 3.

The transfer function of the proposed filter with Gm1=Gm2, Dmin1=Dmin2, and Cint1=Cint2, can be shown to be given by, $$H_{ana}(f) = \frac{G_{m1}}{C_{int1}} \cdot \sum_{n=0}^{N-1} \left( \frac{\sin \frac{\pi f \alpha_n}{f_s}}{\pi f} \cdot e^{-j \frac{2\pi f}{f_s}} \right)$$

The bandwidth is inversely proportional to the number of taps N and directly proportional to the clock rate $f_s$. Time interleaving has the further advantage of decoupling the relationship between the output sample rate and the bandwidth. By increasing the number of parallel filters to four, for example, the output signal may have a decimation factor N/2 rather than N. Other decimation ratios can be obtained by increasing the number of interleaved parallel filters. N interleaved filters can be used to suppress the decimation and have an output signal sampled at the same frequency as the clock rate $f_s$.

To improve the aliasing performance, a low pass filter in either continuous time domain like an RC filter or a discrete time filter like a windowed integration (integrating time of Ts) sampler can be placed before the proposed filter.

FIG. 4 shows the simulated transfer functions of the filter of the invention in a 25-taps and in a 50 taps realization (solid lines) The dashed lines plot the ideal transfer function obtained by the equations above, and the dotted line show, for comparison, the ideal output of digital FIR filters of the same coefficients.

The invention claimed is:

1. A FIR filter, comprising an input terminal for receiving an input signal, a first filtering circuit comprising: a first integrating capacitor, a first transconductance circuit configured to generate a first current signal proportional to the input signal; a first analog switch commuted by a first digital gate signal and configured to block the first current signal when the first digital gate signal has a first value and to transmit the first current signal to the first integrating capacitor when the first digital gate signal has a second value; wherein the first digital gate signal comprises a periodic series of pulses, wherein the pulses have widths proportional to a set of coefficients of the FIR filter.

2. The FIR filter of claim 1, having a gate generator comprising a memory storing the set of coefficients of the FIR filter and a digital-to-time converter circuit, wherein the set of coefficients of the FIR filter are read from the memory and provided to the digital-to-time converter circuit sequentially and synchronously with a clock signal, and the digital-to-time converter circuit generates, for each received filter coefficient, a pulse having a width proportional thereto.

3. The FIR filter of claim 1, wherein the first integrating capacitor is periodically reset.

4. The FIR filter of claim 1, wherein the charge stored in the first integrating capacitor is periodically transferred to an output circuit.

5. The FIR filter of claim 1, comprising a second filtering circuit comprising: a second transconductance device configured to generate a second current signal proportional to an inverted-phase replica of the input signal; a second analog switch controlled by a second digital gate signal and configured to block the second current signal when the second digital gate signal has the first value and to transmit the second current signal to the first integrating capacitor when the second digital gate signal has the second value; wherein the second digital gate signal consists in a series of pulses of constant width.

6. The FIR filter of claim 5, wherein the second digital gate signal is generated by a second digital-to-time converter circuit whose input is static.

7. The FIR filter of claim 5, having a second integrating capacitor, a third analog switch and a fourth analog switch controlled by digital signals and configured to transfer the first current signal and the second current signal to the first and second integrating capacitor in an interleaved fashion.

8. The FIR filter of claim 5, having a plurality of integrating capacitors and a plurality of analog switches controlled by digital signals and configured to select cyclically an integrating capacitor from the plurality of integrating capacitors, block the first current signal when the first digital gate signal has the first value and to transmit the first current signal to the selected integrating capacitor when the first digital gate signal has the second value, block the second current signal when the second digital gate signal has the first value and to transmit the second current signal to the selected integrating capacitor when the second digital gate signal has the second value.

9. The FIR filter of claim 8, having two integrating capacitors charged alternately.

10. The FIR filter of claim 8, wherein the charges stored in the two integrating capacitors are cyclically transferred to an output circuit and determine a sampled output signal.

11. The FIR filter of claim 10, having a gate generator comprising a memory storing the set of coefficients of the FIR filter and a digital-to-time converter circuit, wherein the set of coefficients of the FIR filter are read from the memory and provided to the digital-to-time converter circuit sequentially and synchronously with a clock signal, and the digital-to-time converter circuit generates, for each received filter coefficient, a pulse having a width proportional thereto, wherein a sampled output signal is decimated relative to the clock signal.

* * * * *